United States Patent [19]

Yokoyama

[11] 4,346,349

[45] Aug. 24, 1982

[54] MULTI-CHANNEL AUDIO POWER AMPLIFIER

[75] Inventor: Kenji Yokoyama, Hamamatsu, Japan

[73] Assignee: Nippon Gakki Seizo Kabushiki Kaisha, Hamamatsu, Japan

[21] Appl. No.: 147,502

[22] Filed: May 7, 1980

[30] Foreign Application Priority Data

May 10, 1979 [JP] Japan .................................. 54-57464

[51] Int. Cl.³ .......................... H03F 3/38; H03F 3/68
[52] U.S. Cl. .................................... 330/10; 330/126; 330/295
[58] Field of Search ......................... 330/10, 126, 295

[56] References Cited

U.S. PATENT DOCUMENTS 4,240,036 12/1980 Kohler .................................. 330/10

FOREIGN PATENT DOCUMENTS

52-29141 3/1977 Japan .................................. 330/126

Primary Examiner—James B. Mullins
Assistant Examiner—Gene Wan
Attorney, Agent, or Firm—Cushman, Darby & Cushman

[57] ABSTRACT

A multi-channel audio power amplifier is arranged to amplify, by an analog amplifying circuit, high frequency range components of an audio signal and to amplify low frequency range components of said signal by a class D amplifying circuit, to thereby enhance the power efficiency of the amplifier. The carrier frequency of the class D amplifying circuit is set lower than that employed conventionally, to eliminate spurious radiation of the carrier signal.

7 Claims, 13 Drawing Figures

MULTI-CHANNEL AUDIO POWER AMPLIFIER

BACKGROUND OF THE INVENTION

1. Field of the Invention

The present invention relates to an audio power amplifier, and more particularly to a multi-channel amplifier arranged to amplify high frequency components of an audio signal by an analog amplifying circuit and to amplify low frequency components by a class D amplifying circuit.

2. Description of the Prior Art

Figure 1:
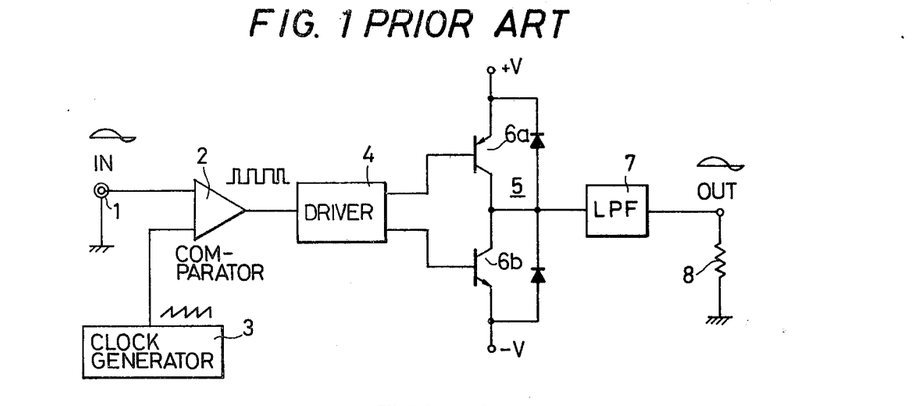
FIG. 1 is a circuit diagram of an amplifier employing a known class D amplifying circuit.

As an audio signal amplifying circuit, there are generally known a class A amplifying circuit which is designed so that a collector current flows at all times and a class B amplifying circuit designed so that the collector current flows for each half cycle when an alternating base input is applied. In an amplifier using such circuit as mentioned above, problems are that its power supply circuit becomes great both in size and weight, and that the power efficiency is poor which is especially prominent in an amplifier employing class A amplifying circuit. To cope with these problems, there has been provided an amplifier employing a so-called class D amplifying circuit to realize compact size, light weight and good power efficiency. An example of this prior art amplifier is shown in FIG. 1, in which an input audio signal to an input terminal 1 is supplied to a comparator 2 for comparison between said audio signal and a carrier signal having a sawtooth waveshape supplied from a clock pulse generator 3 to form a pulse-width-modulated signal. This pulse-width-modulated signal is supplied, via a driver circuit 4, to a switching circuit 5 which comprises transistors 6a and 6b of SEPP connection to thereby cause alternate on-off actions of these transistors 6a and 6b in accordance with the pulse width of said pulsewidth-modulated signal, so that the pulse-width-modulated signal is power-amplified through the switching transistors 6a and 6b with suitable source voltages ±V. The output signal of this switching circuit 5 is demodulated by an averaging low-pass filter 7, i.e. removal of the carrier signal from this output signal, to thereby obtain an audio output to drive a load 8 such as a speaker.

In such prior art amplifier as mentioned above, however, the above-stated advantages are accompanied by a disadvantage in that the fidelity of signal amplification is somewhat inferior. Accordingly, when it is desired to faithfully amplify the audio signal of the high frequency range, there is the necessity to set high the carrier frequency for the pulse-width modulation, for example, when it is intended to handle a single of a frequency up to 50 kHz, the carrier frequency is set at about 500 kHz. By so arranging, however, a switching transistor having a high cut-off frequency is required, and a further drawback is expected that there is produced spurious radiation of the carrier signal which adversely affects other electronic devices. The problem of this spurious radiation of carrier signal is a very troublesome one in view of the fact that this amplifier is a power amplifier. Furthermore, there could arise another problem of an increase in distortion caused by the leak of carriers.

SUMMARY OF THE INVENTION

It is a primary object of the present invention to provide an amplifier having good power efficiency and high fidelity.

Another object of the present invention is to materialize a compact size and light weight of the entire amplifier through minimizing the power loss of the amplifier as a whole and minimizing the size of the heat radiator, both as a result of the above-said good power efficiency.

Still another object of the present invention is to provide an amplifier comprising an analog amplifying circuit for power amplification of high frequency components of an audio signal and a class D amplifying circuit for power amplification of low frequency components of said signal, so that the frequency of the carrier signal of the class D amplifying circuit is set low to allow the employment of a switching element of this class D amplifying having a relatively low cut-off frequency, and also that spurious radiation can be prevented.

A further object of the present invention is to provide an amplifier of the type described above, which is arranged so that the output signal applied to a load is fed back to the input side of the amplifier to suppress carrier signal leakage in the pulse-width-modulating circuit system and to reduce distortions in said circuit system.

DETAILED DESCRIPTION OF THE PREFERRED EMBODIMENT

The present invention will hereunder be described with respect to the preferred embodiment by referring to exemplary FIGS. 2 to 12.

Figure 2:
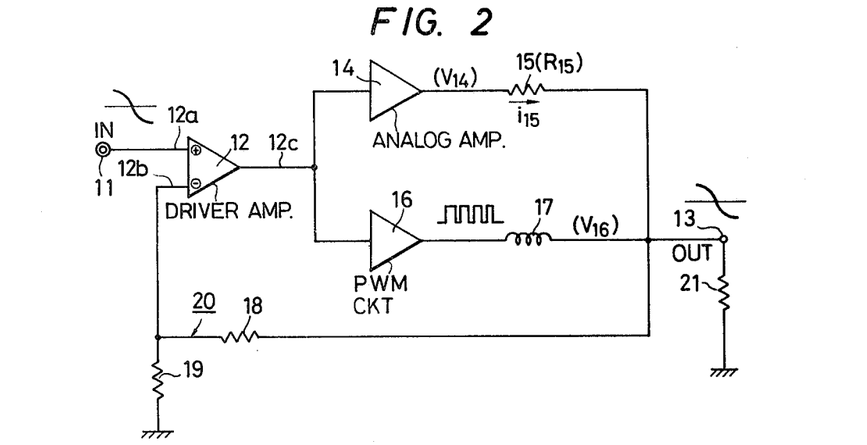
FIG. 2 is a circuit diagram showing an embodiment of the amplifier according to the present invention.

FIG. 2 is a circuit diagram showing a first embodiment of the amplifier according to the present invention. In FIG. 2, an input signal which is applied to an input terminal 11 is adapted to be inputted to a non-inverting input terminal 12a of a driver amplifying circuit 12. This driver amplifying circuit 12 is a circuit assigned to amplify a low-level input signal up to a required level, and it is constructed with an ordinary analog amplifying circuit and has a flat and sufficient gain over the entire audio frequency range. Between an output terminal 12c of this driver amplifying circuit 12 and an output terminal 13 to which is connected a load 21 such as a speaker are inserted an analog power amplifying circuit 14 and a resistor 15 constituting an impedance circuit which are provided in this order in series therebetween. Furthermore, apart from the aforesaid insertion, between the output terminal 12c and the output terminal 13 is also inserted a series connection of a pulse-width-modulating circuit 16 and a coil 17 which constitutes a low-pass filter circuit of 6 dB/octave. The circuit 14 may be comprised of an ordinary analog amplifying circuit such as direct-coupled amplifying circuit, and this is a power amplifying circuit assigned to power-amplify the high frequency range components of an audio frequency signal. In actual practice, this high frequency range power amplifying circuit 14 is capable of covering a frequency range of 0~100 kHz. Also, the pulse-width-modulating circuit 16 and the coil 17 jointly constitute a so-called class D amplifying circuit, the concrete arrangement of which may be similar to that of the conventional circuit shown in FIG. 2 and which converts an audio signal (analog signal) to a pulse-width-modulated signal, and then amplifies the level thereof up to the level of the power voltage, and finally demodulates same back to the analog signal form. This class D amplifying circuit is assigned to perform power amplification of those low frequency range components of the audio siganl. In this instance, the pulse-width-modulating circuit 16 is arranged so that its carrier frequency $f_{ca}$ is set at a relatively low frequency of the order of, for example, 20 kHz. If the power efficiency of the high frequency range power amplifying circuit 14 is sacrificed to some extent, this carrier frequency $f_{ca}$ can be set at a lower value. Also, between the output terminal 13 and the ground are connected resistors 18 and 19. The common connection point of these resistors 18 and 19 is connected to the inverting input terminal 12b of the driver amplifying circuit 12. That is, the output signal at the output terminal 13 is negative-fedback at the dividing ratio set by the resistors 18 and 19, and thus these resistors 18 and 19 constitute a negative feedback circuit. It should be understood here that, in the above-mentioned circuit arrangement, the cut-off frequency $f_c$ which is determined by a time constant which, in turn, is defined by the coil 17 and by a load 21 is set lower than the above-mentioned carrier frequency $f_{ca}$ so that the carrier signal is cut by the low-pass filter coil 17.

Figure 3:
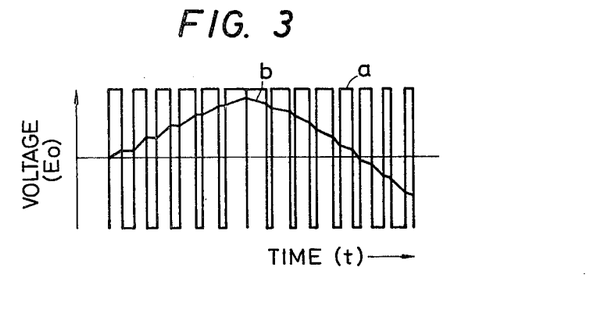
FIG. 3 is a waveshape diagram showing the relationship between the pulse-width-modulated signal and the output signal in the amplifying system having a pulse-width-modulating circuit in the embodiment of FIG. 2.
Figure 4:
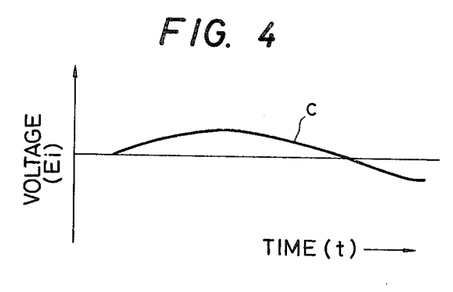
FIG. 4 is a waveshape diagram of the input signal in the embodiment of FIG. 2.
Figure 5:
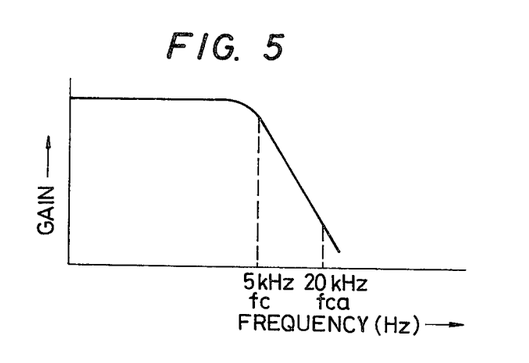
FIG. 5 is a diagram showing the frequency characteristic of the gain of the amplifying system having the pulse-width-modulating circuit in the embodiment of FIG. 2.
Figure 6:
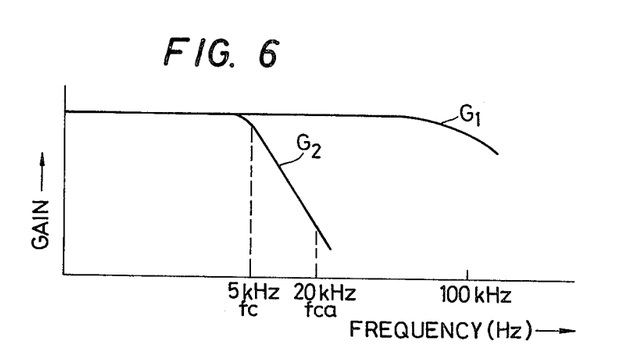
FIG. 6 is a diagram showing the relationship between the frequency characteristics of the gain of the amplifying system having the pulse-width-modulating circuit and the gain of a high frequency range power amplifying circuit in the embodiment of FIG. 2.
Figure 7:
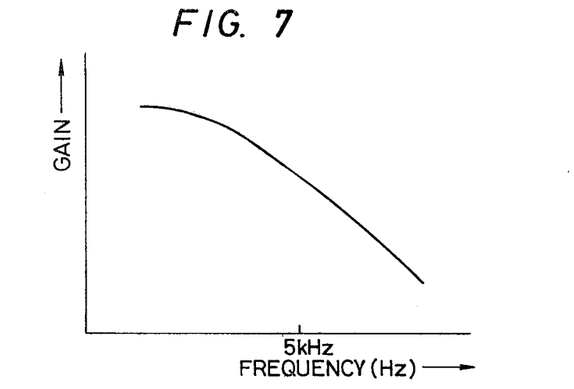
FIG. 7 is a diagram showing the frequency characteristic of an audio signal energy which is represented by a radio of a time when a load is driven by an amplifier to amplify the audio signal, to a unit period.

Description will hereunder be made of the operation of the amplifier having the foregoing circuit arrangement. An input signal which may be an audio signal and which is applied to the input terminal 11 is first amplified up to a required level by the driver amplifying circuit 12, and thereafter it is supplied to the high frequency range power amplifying circuit 14 and also the pulse-width-modulating circuit 16. The pulse-width-modulating circuit 16 performs pulse-width modulation of the output signal of the driver amplifying circuit 12 by the carrier which may be, for example, of the order of 20 kHz, and further it amplifies this signal to such extent that its peak level is substantially equal to the level of the power supply voltage, and outputs such pulse-width-modulated signal. Needless to say, the output in such instance has a power level which is sufficiently large enough to drive the load 21 via the coil 17. And, the output of this pulse-width-modulating circuit 16 is supplied to the series circuit of the coil 17 and the load 21. The signal which is derived at the output terminal 13 is of a voltage b which represents a voltage obtained by removing the carrier signal component from the voltage a of the pulse-width-modulated signal, i.e. a demodulated voltage b, as shown in FIG. 3. This voltage b is an amplified signal of the input signal voltage c applied to the input terminal 11 as shown in FIG. 4. In this instance, the circuit which is comprised of the pulse-width-modulating circuit 16 and the coil 17 has no resolving ability for a frequency component close to or above the carrier frequency $f_{ca}$ among the frequency components of the input signal. Accordingly, these frequency components can not be substantially amplified by said circuit. Since the cut-off frequency $f_c$ which is determined by the time constant defined by the coil 17 and the load 21 is set lower than the aforesaid carrier frequency $f_{ca}$, the output signal derived at the output terminal 13 will become such that, for those frequency components above said cut-off frequency $f_c$, their levels will drop progressively. As such, the frequency characteristic of the circuit comprised of said pulse-width-modulating circuit 16 and the coil 17 will become as shown in FIG. 5 in case the carrier frequency $f_{ca}$ is assumed to be 20 kHz and said cut-off frequency $f_c$ is set at 5 kHz. On the other hand, the high frequency range power amplifying circuit 14 has a substantially constant gain for the entire audio frequency range, which, in practice, is the range of 0~100 kHz, so that it has a gain also in the low frequency range in the same way as has the circuit comprising the pulse-width-modulating circuit 16 and the coil 17, as shown in FIG. 6. In FIG. 6, $G_1$ represents the gain of the high frequency range power amplifying circuit 14, and $G_2$ represents the gain of the circuit which is comprised of the pulse-width-modulating circuit 16 and the coil 17. Here, by setting such parameters as the circuit constant of the high frequency range power amplifying circuit 14 and the pulse-width-modulating circuit 16 so as to insure that the output voltage $V_{14}$ of the high frequency range power amplifying circuit 14 and the output voltage $V_{16}$ of the circuit comprised of the pulse-width-modulating circuit 16 and the coil 17 for a given input signal in the low frequency range are substantially equal to each other, i.e. by setting equal the respective gains of both the high frequency range power amplifying circuit 14 side and the pulse-width-modulating circuit 16 side, the load 21 will be driven by the output of the circuit which is formed with the pulse-width-modulating circuit 16 and the coil 17, because of the fact that the output impedance of this latter circuit is sufficiently low, so that hardly any current is allowed to flow to the resistor 15.

In other words, the current $i_{15}$ which flows through this resistor 15 having a resistance value of $R_{15}$ is given by $$i_{15}=(V_{14}-V_{16})/R_{15}.$$

However, as stated above, $V_{14}\approx V_{16}$. Therefore, $i_{15}\approx 0$. And, the power loss of the high frequency range power amplifying circuit 14 which absorbs the current which is to flow through the resistor 15 at such time is very small, being $i_{15}\approx 0$. Also, because $i_{15}\approx 0$, the amplifying system of the high frequency range power amplifying circuit 14 side at such time will not give any adverse effect on the output signal of the circuit comprised of the pulse-width-modulating circuit 16 and the coil 17, so that said amplifying system will not distort this output signal. Thus, those low frequency range components among the audio signal outputted from the driver amplifying circuit 12 are power-amplified mainly by the circuit which is comprised of the pulse-width-modulating circuit 16 and the coil 17, and they are supplied to the load 21.

On the other hand, the frequency range power amplifying circuit 14 has, as stated above, a gain throughout the entire audio frequency range. Therefore, it performs power-amplification of such audio signal of the frequency components which can not be amplified by the circuit formed with the pulse-width-modulating circuit 16 and the coil 17, i.e. an audio signal of those frequency components above the cut-off frequency $f_c$, and this circuit 14 supplies the resulting power-amplified audio signal to the load 21 through the resistor 15. At such instance, it will be noted that with respect to the amplifying system on the pulse-width-modulating circuit 16 side will never give an adverse effect on the output signal of the high frequency range power amplifying circuit 14, because the coil 17 has a high impedance for those frequency components above the cut-off frequency $f_c$. It should be understood here that the amplifying system on the high frequency range power-amplifying circuit 14 side is such that, by setting the value of the resistor 15 at about several ohms when the value of the load 21 is about 8 ohms, there is materialized an impedance matching, so that it is possible to substantially suppress the drop of gain caused by this resistor 15, and to reduce the current $i_{15}$ flowing through this resistor. Also, the energy distribution of those frequency components above 5 kHz which are contained in ordinary audio signal is considerably (about one order) smaller as compared with the energy distribution of the frequency components lower than 5 kHz (see FIG. 7), so that, by setting the aforesaid cut-off frequency $f_c$ at about 5 kHz, it may be said that the period of time of driving the load 21 by the high frequency range power amplifying circuit 14 can become extremely small. Accordingly, it is possible to set the power loss caused by the high frequency range power-amplifying circuit 14 at about 1/10 of that in a known circuit intended for amplifying the entire frequency range. Therefore, it is possible to design the final-stage power amplifying element, heat-sink and like elements of this circuit 14 at relatively low performance requirement, or to make them compact in size, light in weight and to make them at a much lower cost.

Figure 8:
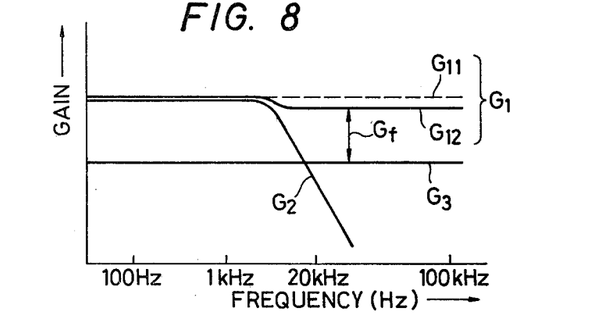
FIG. 8 is a diagram showing the frequency characteristics of the gains at the respective portions and the frequency characteristic of the overall gain in the embodiment of FIG. 2.

As stated above, for those low frequency range components of an audio signal, the load 21 is driven by the output of the amplifying system of the pulse-width-modulating circuit 16 side. Also, with respect to high frequency range components of the audio signal, the load 21 is driven by the output of the amplifying system on the high frequency range power-amplifying circuit 14 side. In such instance, it should be understood that, because of the fact that the output signal derived at the output terminal 13 is divided of its voltage by resistors 18 and 19 and is negatively fedback to the driver amplifying circuit 12, the output voltage which is supplied to the load 21 is controlled at a predetermined gain and in such manner that this gain is flat throughout the entire frequency range, due to this feedback. The respective frequency characteristics in the respective parts of this amplifier and the entire frequency characteristic are shown in FIG. 8. In FIG. 8, $G_1$ represents an open loop gain of the high frequency range power amplifying circuit 14. $G_{11}$ represents a gain thereof without a load. $G_{12}$ represents a gain thereof when loaded. Also, $G_2$ represents an open loop gain of the circuit formed with the pulse-width-modulating circuit 16 and the coil 17. $G_3$ represents the overall gain after feedback. $G_f$ represents the amount of feedback.

In this amplifier, it is possible to set small the power loss of the high frequency range power amplifying circuit 14, and in addition thereto, in view of the fact that the amplifying circuit which is formed with the pulse-width-modulating circuit 16 and the coil 17 is the so-called class D amplifying circuit and that its power loss is essentially small, it is possible to make the power loss of the amplifier as a whole extremely small as compared with the known analog amplifier, and at the same time because of the fact that the high frequency range components are amplified by an ordinary analog amplifying circuit without requiring switching, it is possible to obtain also a superior characteristic for the high frequency range. Also, in this amplifier, it is possible to improve the problem of leakage of carriers which has been encountered always in the amplifiers employing known pulse-width-modulating circuit, i.e. it is possible to improve the problem that the carrier frequency component is contained in the output voltage. That is, the carrier leakage may be considered a distortion for the input signal. With respect to this matter, in this amplifier, the distortion component due to this carrier leakage is negatively fedback to the driver amplifying circuit 12, so that the output voltage at the output terminal 13 is controlled so as to have a phase opposite to that of the leak carriers, by the high frequency range power amplifying circuit 14, so that eventually the carrier component in said output voltage is cancelled out. It should be understood here that the above-mentioned effect will become greater with an increase in the respective open loop gains of both the driver amplifying circuit 12 and the high frequency range power amplifying circuit 14, as a matter of course. Also, the circuit which is formed by the pulse-width-modulating circuit 16 and the coil 17 in this amplifier is small in the generation of distortions when compared with the known class D amplifying circuit. This is because of the fact that, in the amplifier discussed above, the distortion components which are produced on the pulse-width-modulating circuit 16 side, regardless of whether they are low frequency range components, are always cancelled out by the high frequency range power amplifying circuit 14 thanks to the above-said negative feedback.

Figure 9:
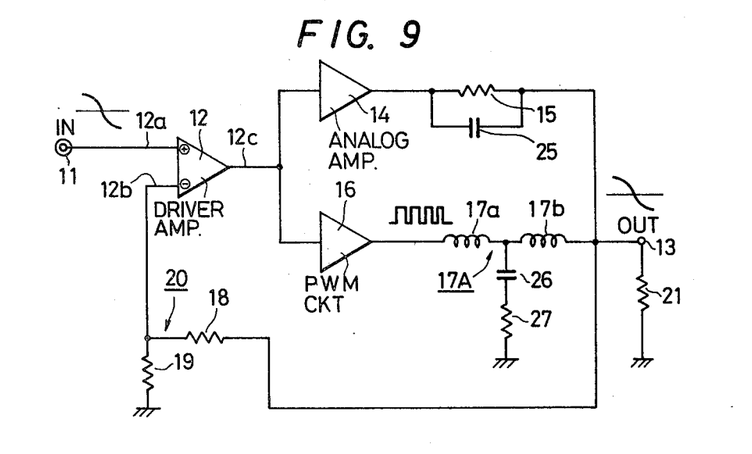
FIG. 9 is a circuit diagram showing another embodiment of the amplifier according to the present invention.
Figure 10:
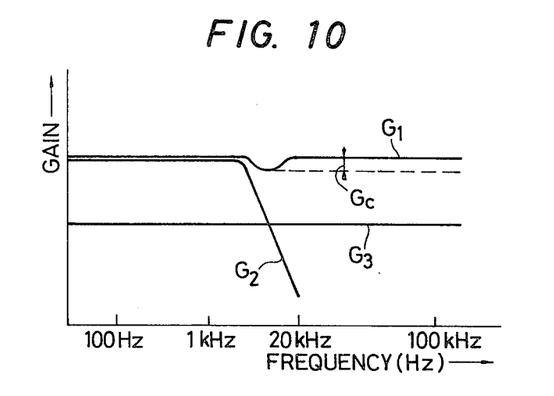
FIG. 10 is a diagram showing the frequency characteristics of the gains at the respective portions and the frequency characteristic of the overall gain in the embodiment of FIG. 9.

FIG. 9 is a circuit diagram showing another embodiment of the amplifier according to the present invention. In this embodiment, the difference from the above-described first embodiment lies in that the impedance circuit which is connected to the output terminal of the high frequency range power amplifying circuit 14 is formed with a resistor 15 and a capacitor 25, and that, on the other hand, the pulse-width remodulating circuit which is connected to the output terminal of the pulse-width-modulating circuit 16 is formed by a low pass filter circuit 17A of 12 dB/octave which is comprised of coils 17a, 17b, a capacitor 26 and a resistor 27. In this embodiment, when the output of the pulse-width-modulating circuit 16 passes through said low pass filter circuit 17A, the high frequency range components of this output are cut by this filter circuit 17A, and in addition thereto the attenuation characteristic in the vicinity of the cut-off frequency $f_c$ of said filter circuit 17A is steep, so that it is possible to further reduce the carrier leakage in the pulse-width-modulating circuit 16 than is in the amplifier of the embodiment shown in FIG. 2. On the other hand, in the signal system on the high frequency range power amplifying circuit 14 side, it is possible to elevate the high frequency range component gain by the impedance-lowering action in the high frequency range, to thereby materialize a reduction of the high frequency range distortion. The frequency characteristics of the respective parts in this amplifier and the frequency characteristic as a whole are as shown in FIG. 10. In FIG. 10, $G_1$ represents an open loop gain of the high frequency range power amplifying circuit 14. $G_2$ represents the open loop gain of the circuit formed with the pulse-width-modulating circuit 16 and the filter 17A. $G_3$ represents an overall gain after negative feedback. $G_c$ represents an amount of gain which is improved by the capacitor 25.

Figure 11:
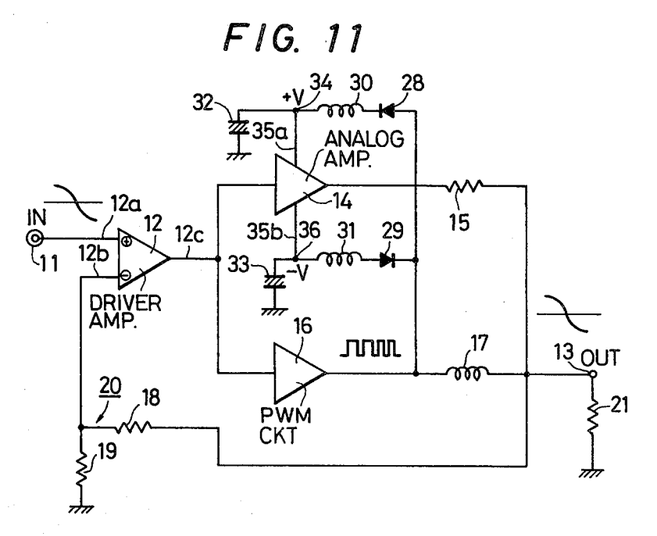
FIG. 11 is a circuit diagram showing still another embodiment of the amplifier according to the present invention.

FIG. 11 is a circuit diagram showing still another embodiment of the amplifier according to the present invention. This embodiment is intended to obtain, in the circuit arrangement identical with that of the first embodiment, a power supply of the high frequency range power amplifying circuit 14 from the output of the pulse-width-modulating circuit 16. More particularly, this instant example shown in FIG. 11 is based on the consideration that the level of the output pulse of the pulse-width-modulating circuit 16 is substantially equal to that of the power supply voltage. In FIG. 11, it will be seen that, to the output terminal of the pulse-width-modulating circuit 16 is connected a circuit which is formed by rectifying diodes 28 and 29 for obtaining a positive power supply and a negative power supply, smoothing choke coils 30 and 31 and smoothing capacitors 32 and 33. This amplifier is arranged further so that the pulse-width-modulated signal derived at the output terminal of the pulse-width-modulating circuit 16 is rectified and smoothed by the above-said circuit, and that the positive voltage derived at the terminal 34 is supplied to the positive power supply input terminal 35a of the high frequency range power supply circuit 14, and also that the negative voltage derived at the terminal 36 is supplied to the negative power supply input terminal 35b of this high frequency range power amplifying circuit 14. Accordingly, in this instant embodiment, the provision of a power supply transformer for the high frequency range power amplifying circuit 14 is not necessary, so that there is the advantage that the amplifier as a whole can be made into a compact size, and in a light weight and at a small manufacturing cost.

Figure 12:
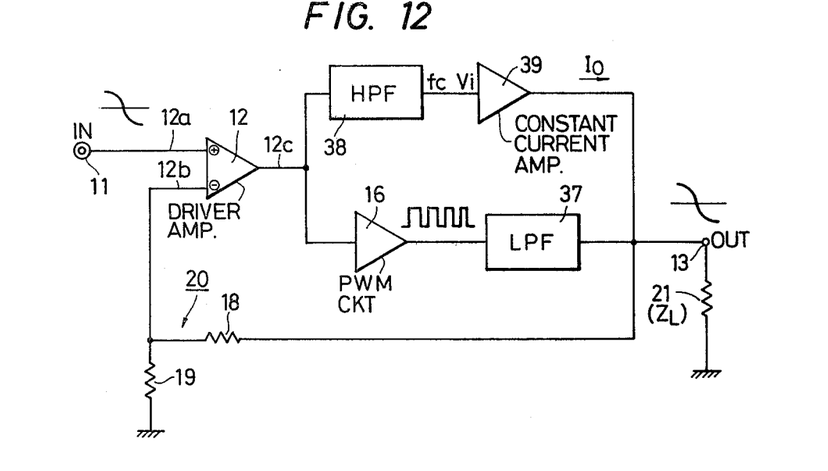
FIG. 12 is a circuit diagram showing a further embodiment of the amplifier according to the present invnetion.

FIG. 12 is a circuit diagram showing a further embodiment of the amplifier according to the present invention. This instant embodiment is different from the respective embodiments described above especially in the arrangement of the signal system for power amplifying the high frequency range components, which is provided between the output terminal 12c of the driver amplifying circuit 12 and the output terminal 13 of the amplifier. More particularly, in FIG. 12, it will be noted that, between the output terminal 12c and the output terminal 13 is inserted, as in the preceding embodiment, a series circuit formed by a pulse-width-modulating circuit 16 and a low pass filter circuit 37 which, in turn, forms a pulse-width-demodulating circuit, and on the other hand, there is inserted therebetween a series circuit formed by a high pass filter circuit 38 and a constant current amplifying circuit 39 which, in turn, constitutes a high frequency range power amplifying circuit. In this arrangement, the high pass filter circuit 38 is arranged so that its cut-off frequency is set equal to the cut-off frequency $f_c$ of a circuit formed with the low pass filter circuit 37 and the load 21. Also, the constant current amplifying circuit 39 is an amplifying circuit which is arranged so that the current $I_O$ of its output terminal is proportional to the input voltage $V_i$ ($I_O \propto V_i$). In this arrangement, the signal system which is comprised of the high pass filter circuit 38 and the constant current amplifying circuit 39 has a characteristic such that the gain with respect to those frequency components lower than said cut-off frequency $f_c$ undergoes an attenuation.

In the above-described circuit arrangement, the audio signal which is amplified by the driver amplifying circuit 12 is cut off of its low frequency range components in the high pass filter circuit 38, with a predetermined attenuation characteristic (for example, 6 dB/octave), and thereafter the resulting signal is supplied to the constant current amplifying circuit 39. The constant current amplifying circuit 39 is such that, when its transconductance is assumed to be $G_M$, and the impedance of the load 21 is assumed to be $Z_L$, this circuit 39 operates to power-amplify the high frequency range components of the audio signal with a gain $G=G_m \cdot Z_L$, and supplies its output to the load 21. Also, the audio signal which is outputted from the driver amplifying circuit 12 is supplied also to the pulse-width-modulating circuit 16. As in the preceding embodiments, only low frequency range components of the audio signal are power-amplified by both the pulse-width-modulating circuit 16 and by the low pass filter circuit 37, and the resulting output is supplied to the load 21. Thus, the load 21 is driven by both the output of the constant current amplifying circuit 39 and the output of the pulse-width-modulating circuit 16.

Figure 13:
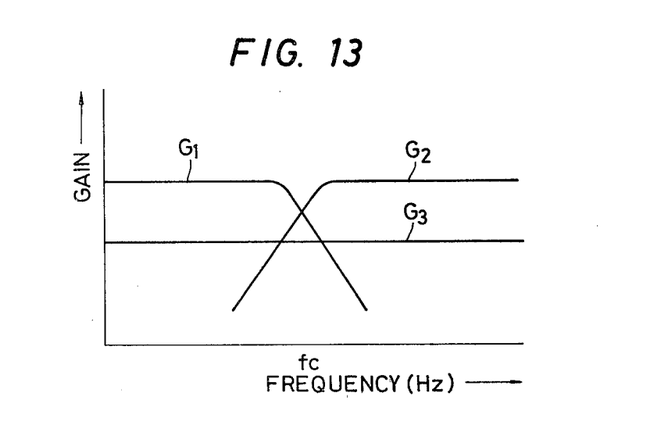
FIG. 13 is a diagram showing the frequency characteristics of the gains at the respective portions and the frequency characteristic of the overall gain in the embodiment of FIG. 12.

In the above-described arrangement, the signal system which is comprised of the high pass filter circuit 38 and the constant current amplifying circuit 39 is such that those signal components lower than the cut-off frequency $f_c$ are cut in correspondence to the attenuation characteristic of this signal system, so that it is possible to determine the power loss of the constant current amplifying circuit 39 based only on those signal components above the cut-off frequency $f_c$. Accordingly, by setting the cut-off frequency $f_c$ at an appropriate value, it becomes possible to greatly reduce the power loss of the constant current amplifying circuit 39 because of the fact that, in general, the energy of audio signals is small in its high frequency range and large in its low frequency range. Also, the pulse-width-modulating circuit 16 and the low pass filter circuit 37 for amplifying those low frequency range components in an audio signal essentially have a small power loss. Accordingly, in this instant amplifier, as well as in the respective embodiments described above, it is possible to greatly reduce the power loss of the entire circuit and to obtain an operation characteristic which is superior in the high frequency range. Those frequency characteristics of the respective parts in this instant amplifier and the overall frequency characteristic of this amplifier are shown in FIG. 13. In FIG. 13, $G_1$ represents an open loop gain of the circuit which is comprised of a pulse-width-modulating circuit 16 and a low pass filter circuit 37. $G_2$ represents an open loop gain of a constant current amplifying circuit. $G_3$ represents an overall gain after feedback.

Each of the above-described embodiments invariably has a construction between the driver amplifying circuit 12 and the output terminal 13 such that it is constructed by two channels, i.e. one high frequency range power-amplified signal system and one low frequency range power-amplified signal system. This construction, however, may be made in multiple channels by, for example, dividing the high frequency range power amplified signal system into two or more channels.

What is claimed is:

1. A power amplifier for amplifying audio frequency signals that may have frequency components within a first range of frequencies, comprising:
   a driver amplifier for amplifying an input signal, the driver amplifier being operable over the entire first range of frequencies,
   a high frequency analog power amplifying circuit having an input coupled to the driver amplifier for power-amplifying with a substantially flat gain components of an output signal from the driver amplifier that are within a second range of frequencies within the first range;
   a low frequency pulse modulation and demodulation circuit having an input coupled to the driver amplifier for power-amplifying components of an output signal from the driver that are within a third range of frequencies within the first range, the first range including at least one frequency that is lower than any frequency in the second range, the pulse modulation and demodulation circuit comprising a pulse width modulator operating at a predetermined carrier frequency and an inductor coil acting as a low pass filter having a cut-off frequency lower than that of the carrier;
   an output terminal for delivering an output signal of the power amplifier including signals from both the high frequency analog amplifier and the low frequency pulse circuit;
   a resistor having an impedance higher than that of the low pass filter of the pulse modulation and demodulating circuit for frequencies in the third range coupling an output of the high frequency analog power amplifying circuit to the output terminal; and
   a negative feedback circuit providing a negative feedback from the output terminal to the driver amplifier.

2. An amplifier according to claim 1, further comprising:
   a capacitor connected in parallel to said resistor.

3. An amplifier according to claim 1 further comprising:
   means for rectifying an output voltage of said pulse-width modulation circuit; and
   means for smoothing an output voltage from said rectifying means, the smoothed output voltage being used as a power supply voltage of said high frequency power amplifying circuit.

4. An amplifier according to claim 1 wherein:
   said high frequency power amplifying circuit comprises a high pass filter circuit and a constant current amplifying circuit for delivering an output current proportional with an output voltage of said high pass filter circuit.

5. An amplifier according to claim 1 wherein:
   said carrier signal has a frequency of substantially 20 kHz.

6. An amplifier according to claim 5, wherein:
   said cut-off frequency of the low pass filter is substantially 5 kHz.

7. An amplifier according to claim 1, wherein:
   said low pass filter circuit is comprised of a series connection of two coils and a series-connected circuit of a resistor and a capacitor connected between a common connecting point of said two coils and circuit ground.

* * * * *